(12) United States Patent
Shen

(10) Patent No.: US 7,915,690 B2
(45) Date of Patent: Mar. 29, 2011

(54) DIE REARRANGEMENT PACKAGE STRUCTURE USING LAYOUT PROCESS TO FORM A COMPLIANT CONFIGURATION

(75) Inventor: Geng-Shin Shen, Hsinchu (TW)

(73) Assignees: ChipMos Technologies Inc, Hsinchu (TW); ChipMos Technologies (Bermuda) Ltd, Hamilton (BM)

( * ) Notice: Subject to any disclaimer, the term of this patent is extended or adjusted under 35 U.S.C. 154(b) by 0 days.

(21) Appl. No.: 12/635,388

(22) Filed: Dec. 10, 2009

(65) Prior Publication Data

US 2010/0084759 A1    Apr. 8, 2010

Related U.S. Application Data

(62) Division of application No. 12/325,334, filed on Dec. 1, 2008, now Pat. No. 7,662,667.

(30) Foreign Application Priority Data

Dec. 20, 2007 (TW) .............................. 96149052 A

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)
*H01L 23/34* (2006.01)
*H01L 23/48* (2006.01)

(52) U.S. Cl. ......... 257/390; 257/723; 257/738; 257/786

(58) Field of Classification Search .................. 257/690, 257/723, 738, 786, E23.141
See application file for complete search history.

(56) References Cited

U.S. PATENT DOCUMENTS 7,196,408 B2    3/2007 Yang et al.
2005/0124093 A1*  6/2005 Yang et al. .................... 438/110

\* cited by examiner

*Primary Examiner* — William M. Brewster
(74) *Attorney, Agent, or Firm* — Ming Chow; Sinorica, LLC

(57) ABSTRACT

A die rearrangement package structure is provided, which includes a die that having an active surface and a bottom surface, and a plurality of pads is disposed on the active surface; a package body is provided to cover a die and the active surface being exposed; a polymer material with at least one slit is provided to cover the active surface and the pads is exposed from said slits; one ends of a plurality of metal traces is electrically connected to each pads; a protective layer is provided to cover the active surface of the dies and each metal traces, and the other ends of the metal traces being exposed; a plurality of connecting elements is electrically connected other ends of the metal traces, the characterized in that: the package body is a B-stage material.

4 Claims, 14 Drawing Sheets

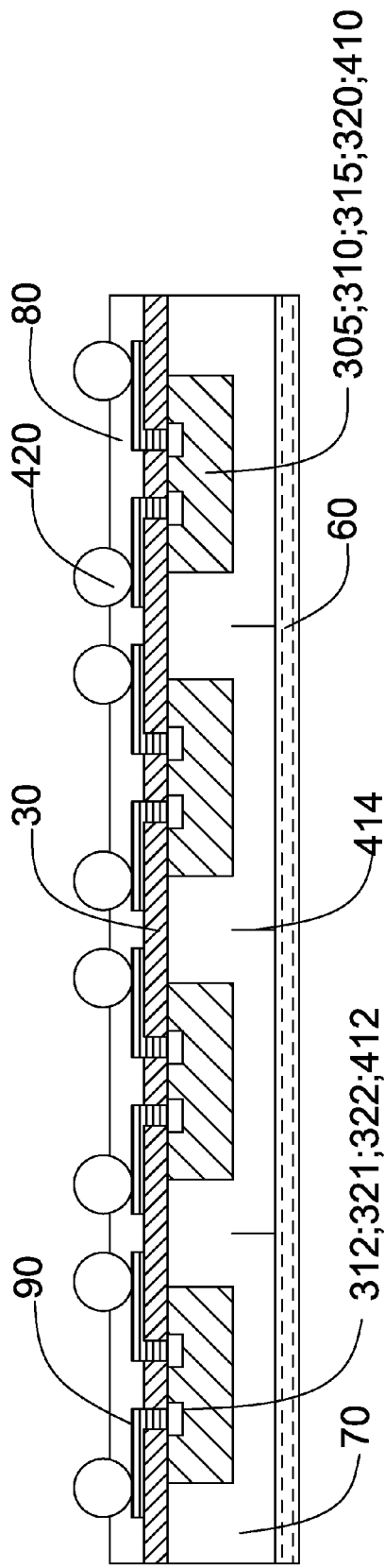
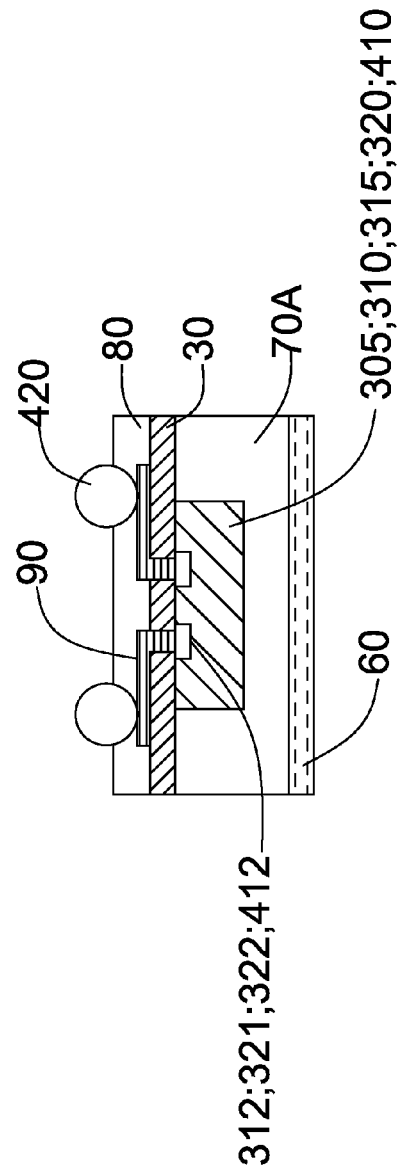

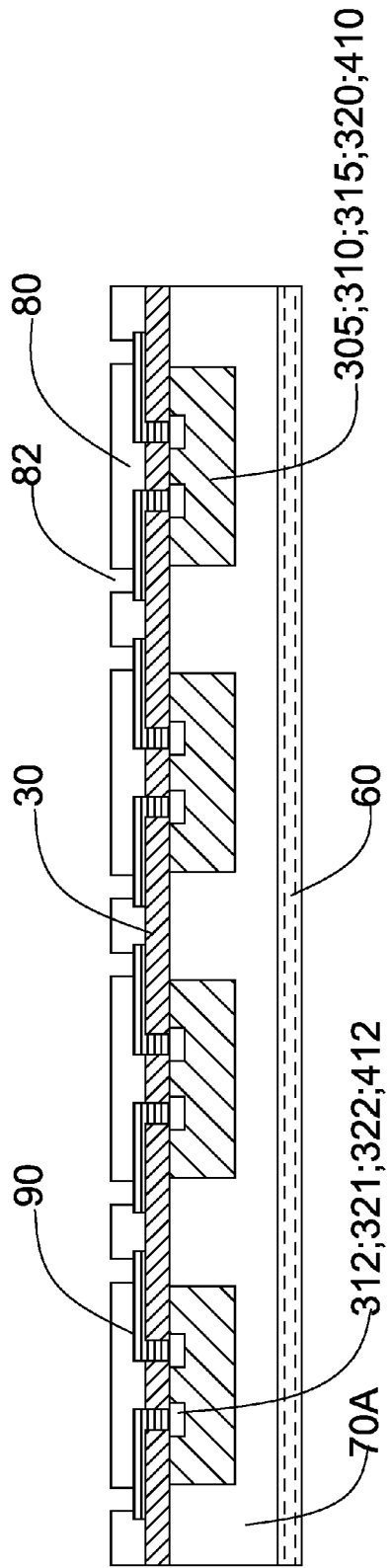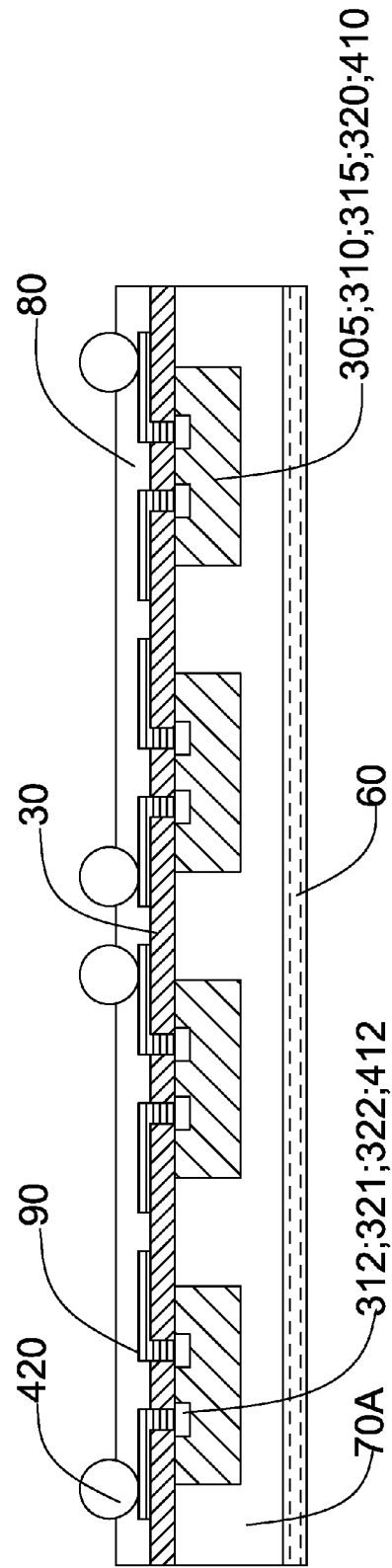

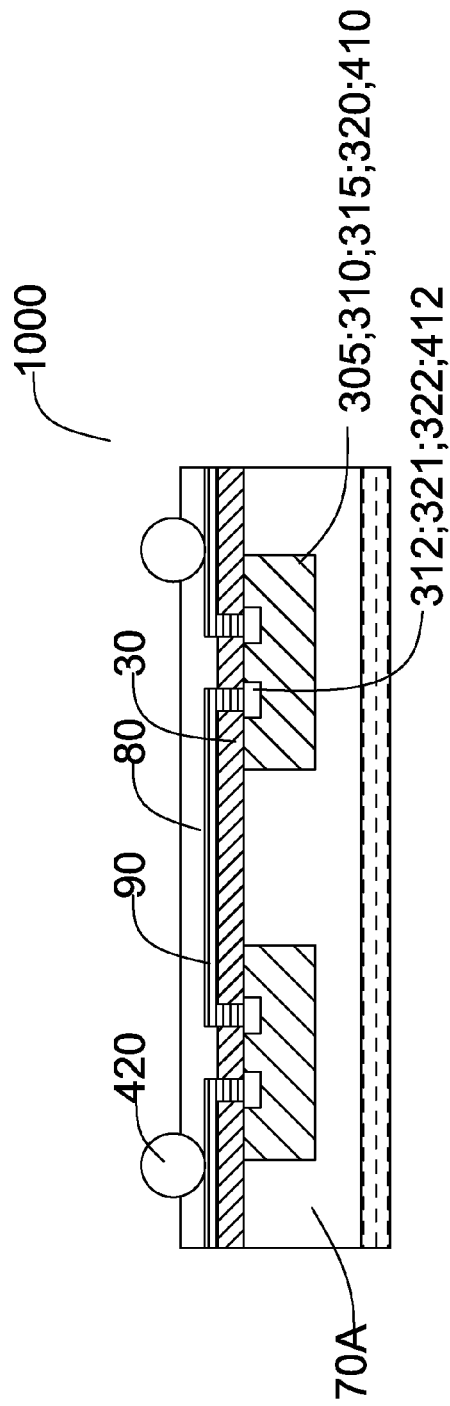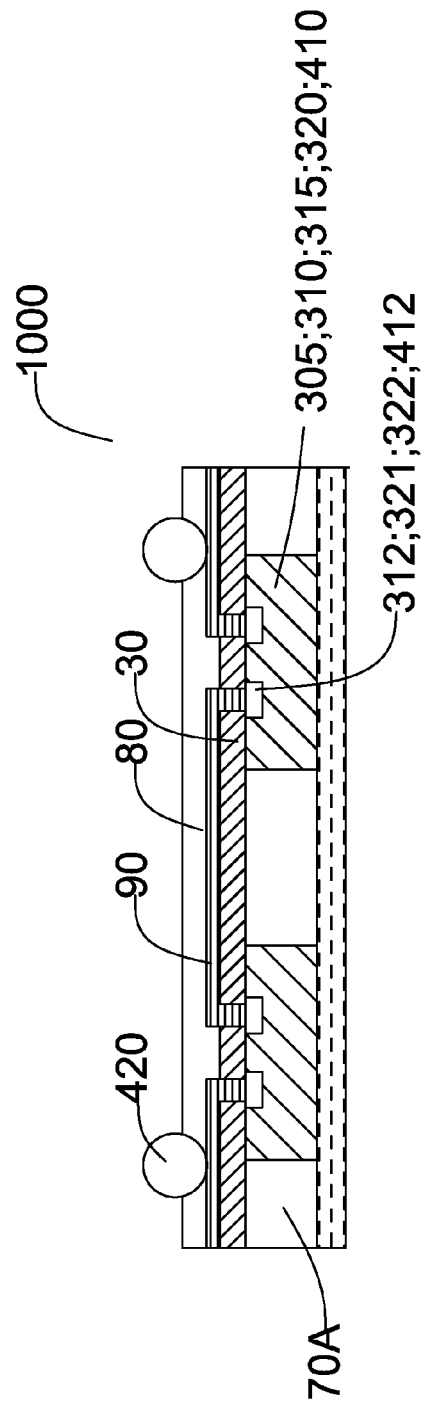
Fig. 13A
Fig. 13B

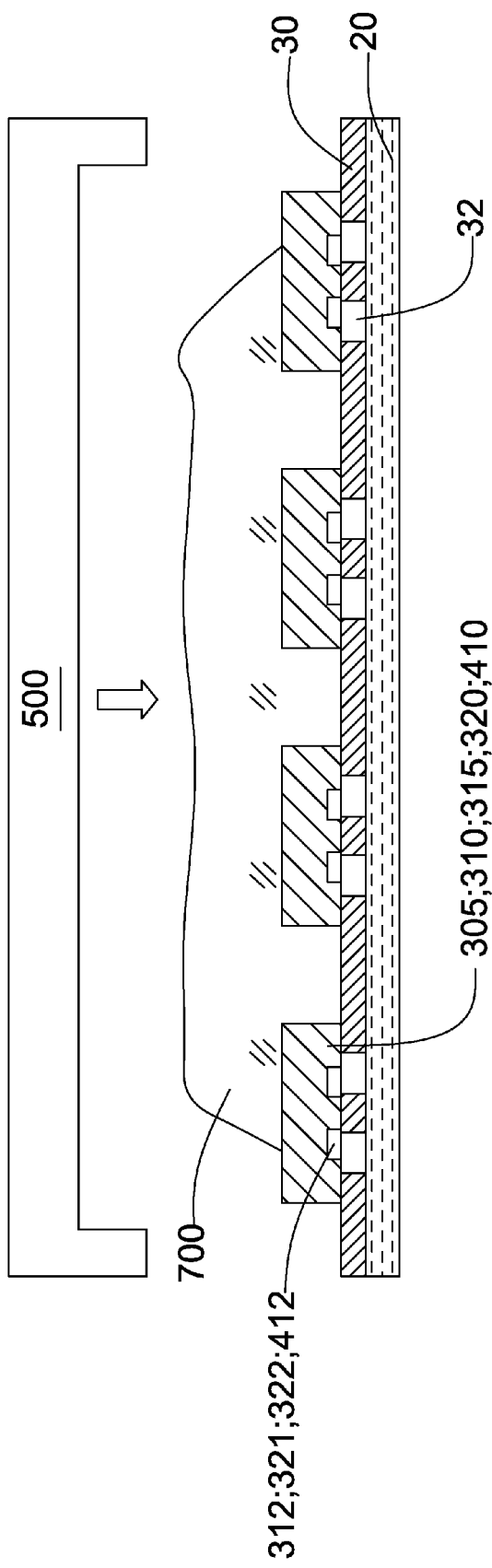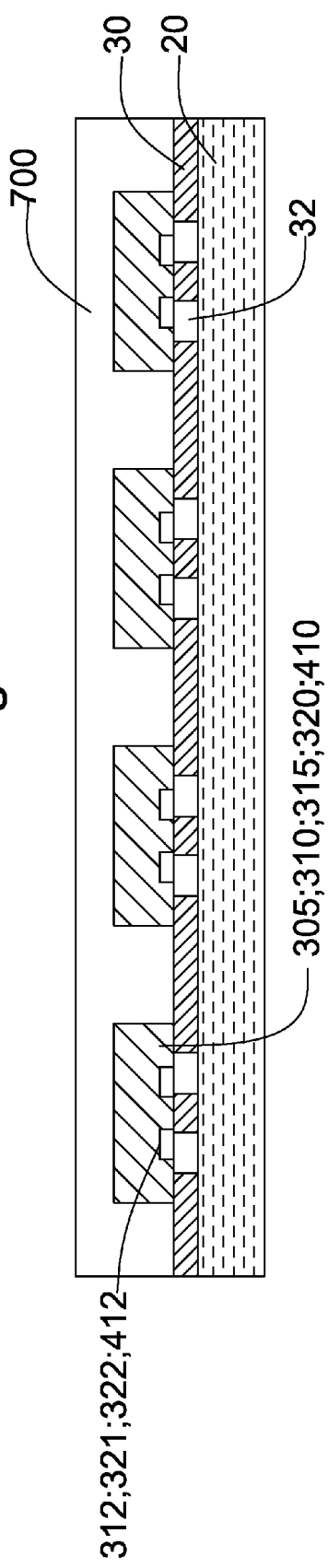

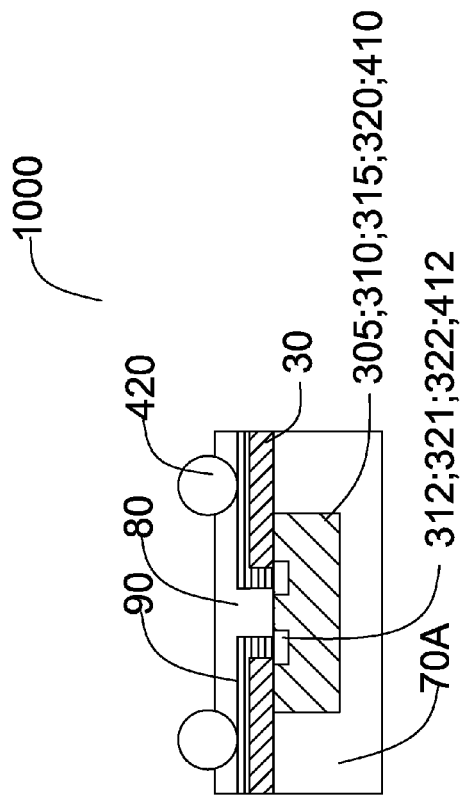
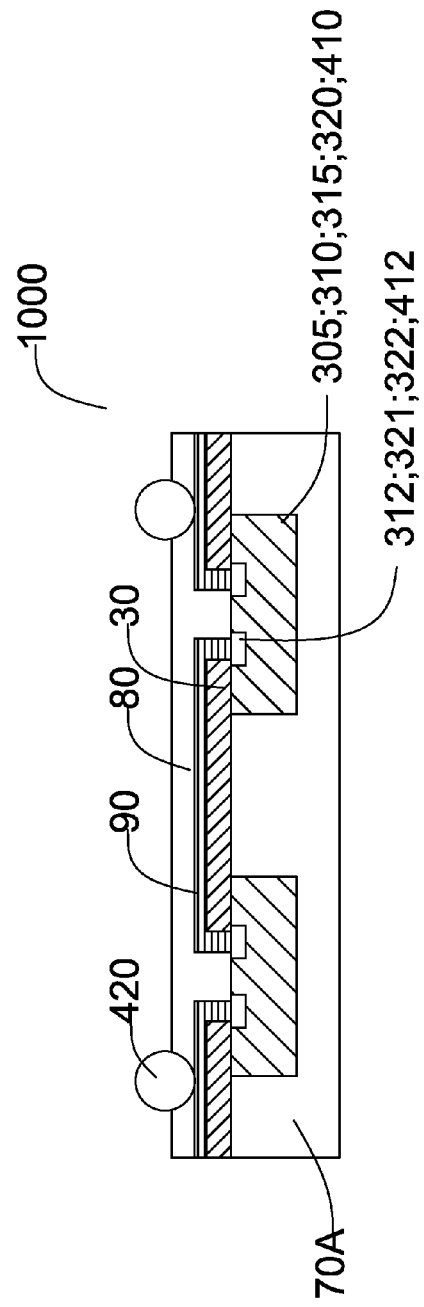

DIE REARRANGEMENT PACKAGE STRUCTURE USING LAYOUT PROCESS TO FORM A COMPLIANT CONFIGURATION

This application is a divisional application of and claims a priority to the U.S. patent application Ser. No. 12/325,334, filed on Dec. 1, 2008, now U.S. Pat. No. 7,662,667 which claimed a priority to a foreign patent application in Taiwan TW096149052, filed on Dec. 20, 2007.

BACKGROUND OF THE INVENTION

1. Field of the Invention

The present invention is related to a packaging method of semiconductor, more particularly, to a package method and a structure of dies rearrangement by a redistribution layer process to form a module with package body.

2. Description of the Prior Art

Miniaturized semiconductor dice has been a trend for its various functions. These semiconductor dies should be provided with more and more I/O pads within a smaller region, so the density of metal pins raises. Thus, the package technology of lead frame has been replaced by the technology of ball grid array (BGA). It is advantageous for BGA to provide more compact density and have solder less subject to damage and distorted.

With 3C products in fashion, such as cell phone, PDA or iPod, these 3C products are equipped with at least one systemic chip within a smaller volume. A wafer level package (WLP) has been developed to packaging a wafer before sawing. U.S. Pat. No. 5,323,051 discloses one kind of wafer level package. However, for WLP, the increasing number and the reduced pitches of the bonding pads result in signal coupling and noise. In addition, the reliability of package may be reduced because of the reduced pitches. Thus, WLP aforementioned may not satisfy the design of smaller dies.

For resolving the issue, U.S. Pat. No. 7,196,408 teaches a method for the semiconductor process. A plurality of good dies is after tested and sawed rearranged on another substrate for the sequential packaging process. Those rearranged dies have wider pitches for the suitable distribution of bonding pads on the dies, such as using fan out technology. Such a method may resolve the issues of signal coupling and noise caused by small pitches.

However, for the semiconductor chip with smaller and thinner packaging structure, before the wafer saw, the wafer may be processed by a thinning process, such as thinning the wafer in the thickness of 2 to 20 mils by backside lapping. Then, the wafer is sawed to become dice units. Those thinned dies are rearranged on another substrate. Then, a molding process is applied on those thinned dies to form a molding structure. Because both the dies and the molding structure are thin very much, the stress from the molding structure itself would cause curl after the substrate is separated from the molding structure. The curl of the molding structure may make a sequential saw process difficult.

Accordingly, the present invention provides a packaging method for dies rearrangement to efficiently resolve the issue of curl on a molding package.

SUMMARY OF THE INVENTION

According to the problems described above, the object of the present invention is to provide a die rearrangement package structure with the alignment mark and the package method package structure. Thus, the main object of the present invention is to provide a B-stage material to encapsulate the die to increase the yield and the reliability.

Another object of the present invention is to provide the packaging method for dies rearrangement. The dies derived from a 12-inches wafer are rearranged on the substrate of an 8-inches wafer. The packaging equipments for the 8-inches wafer may be utilized to reduce the packaging cost.

Another object of the present invention is to provide the packaging method of dies rearrangement. All of dies packaged are known good ones to reduce the packaging and manufacturing costs.

According to above objects, the present invention provides a die rearrangement package method, which includes: providing a first substrate having a top surface and a bottom surface, a polymer material is disposed on the top surface to form a plurality of regions with at least one slits; providing a plurality of dies having an active surface and a back side, and a plurality of pads is disposed on the active surface; then, the active surface of each plurality of dies is flipped on one of the plurality of regions and the plurality of pads is aligned the slit; providing a second substrate, and a B-stage material is disposed thereon; forming a package body for assembling the second substrate and the B-stage material and the top surface of the first substrate, such that the each die is covered by the B-stage material; next, performing a baking process to cure the B-stage material to form a curied package body; separating a first substrate to expose the curied package body and the plurality of pads; forming a plurality of metal traces, one ends of each metal trace is electrically connected the pads; forming a protective layer for covering the active surface of each die and each metal trace, and another ends of metal traces being exposed; forming a plurality of connecting element for electrically connecting another ends of each metal trace; and cutting the package body to form a plurality of package structure individually.

The present invention still provides a dice rearrangement package structure, which includes a die that having an active surface and a plurality of pads thereon; a package body for covering the die and the active surface being exposed; a polymer material having at least one slit for covering the active surface of die and the pads is exposed from slits; one ends of plurality of metal traces is electrically connected the pads; a protective layer for covering the active surface of the dies and each metal traces, and another ends of the metal traces being exposed; a plurality of connecting elements is electrically connected the other ends of the metal traces, the characteristic is in that: the package body is a B-stage material.

The present invention yet provides a die rearrangement package structure, which includes a plurality of dies having an active surface and a bottom surface, and a plurality of pads is disposed on the active surface; a package body for covering each dies and the active surface being exposed; a polymer material having an opening is provided for covering the active surface of each dies and the pads being exposed from the opening; one ends of a plurality of metal traces is electrically connected the pads; a protective layer is provided for covering the active surface and the metal traces and another ends of the metal traces being exposed; and a plurality of connecting elements is electrically connected other ends of the metal traces, the characteristic is in that: the package body is a B-stage material.

BRIEF DESCRIPTION OF THE DRAWINGS

FIG. 3 to FIG. 8 shows the cross-sectional view of the one embodiment of the package structure according to the present invention;

FIG. 9 to FIG. 13b shows the cross-sectional view of the module with package body according to the present invention;

FIG. 14 to FIG. 15 shows the cross-sectional view of another embodiment of the package structure according to the present invention;

FIG. 16 to FIG. 20 shows the cross-sectional view of yet embodiment of the package structure according to the present invention; and FIG. 21 shows a cross-sectional view of the still embodiment of the package structure according to the present invention.

DESCRIPTION OF THE PREFERRED EMBODIMENT

The present invention provides a packaging method for dies rearrangement to re-dispose dies on another substrate for packaging. Following illustrations describe detailed the process or steps for understanding the present invention. Obviously, the present invention is not limited to the embodiments of a stacked structure; however, the preferred embodiments of the present invention are illustrated as followings. Besides, the present invention may be applied to other embodiments, not limited to ones mentioned.

Figure 1:
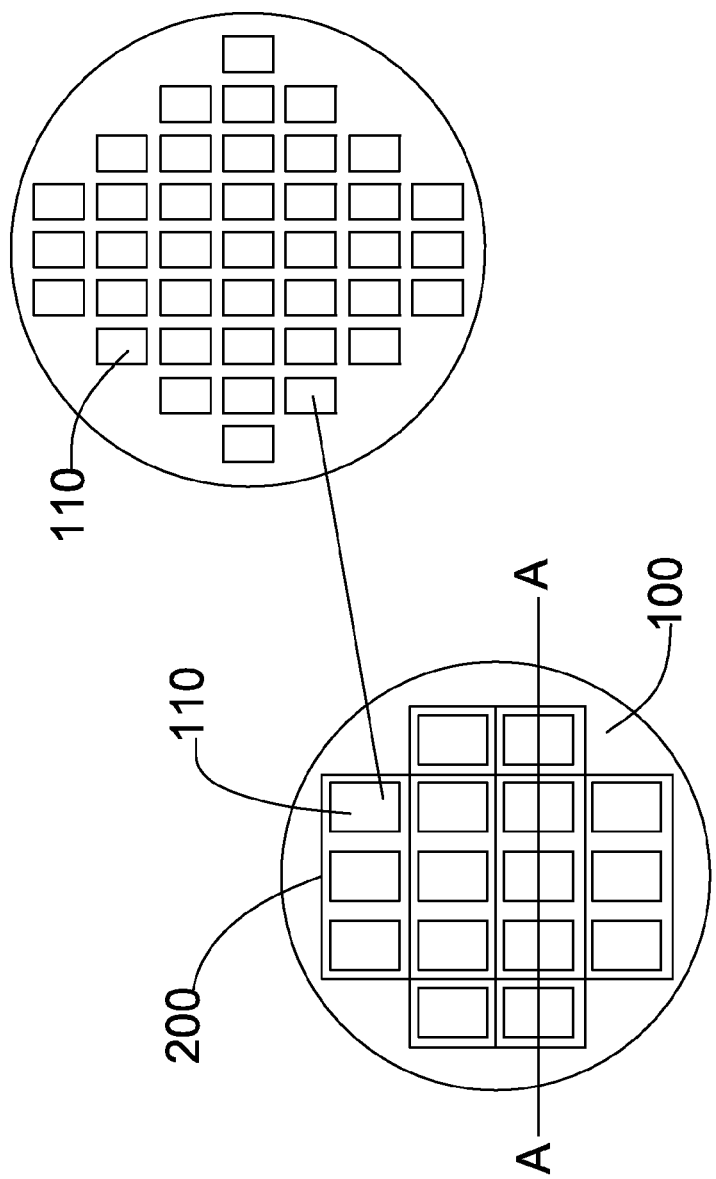
FIG. 1 shows a prior art of the package structure.

In modern semiconductor packaging process, a wafer which has been implemented by a front end process is done by a thinning process in thickness about 2 to 20 mil. A sawing process is applied on the wafer to form a plurality of dies 110 units. Then, these dies 110 are transferred from a pick and place to another substrate 100. Shown in FIG. 1, it is obvious that there are wider pitches among the dies 110 on the substrate 100 than the ones before sawing. Thus, these rearranged dies 100 have wider pitches for the deposition of bonding pads. Moreover, the dies saw from the 12-inches wafer may be rearranged on an 8-inches wafer and implemented by conventional package equipments for 8-inches wafers without setting new equipments for 12-inches wafers. It is noted that the present invention is not limited to 8-inches wafers. Any substrate which may support dies and be in any shape, such as glass, quartz, ceramic, PCB or metal foil, is utilized for the substrate 100 in the present invention.

Figures 2A, 2B:
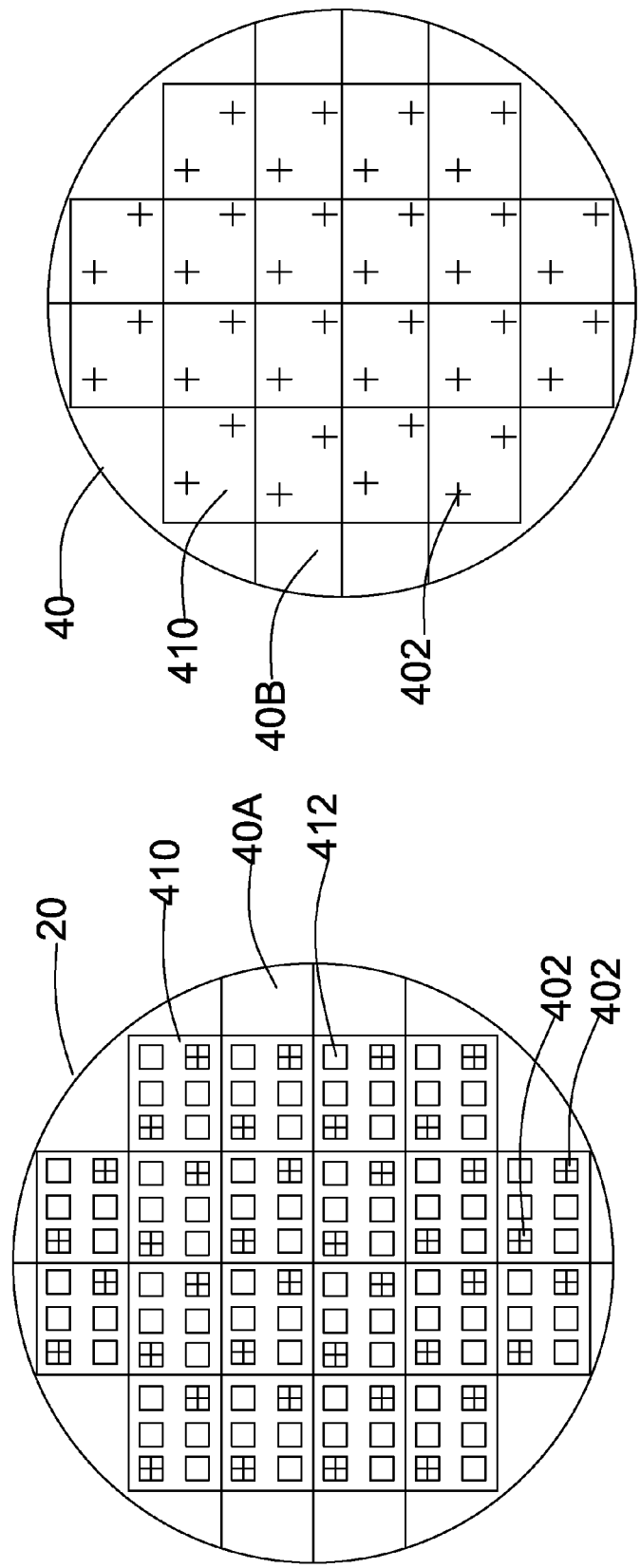
FIG. 2A to FIG. 2B shows the alignment mark on the reverse side of the wafer according to the present invention.

Firstly, referring to FIG. 2A to FIG. 2B, show the vertical view of wafer with alignment marks. As shown in FIG. 2A, the top surface 40A of wafer 40 having a plurality of dies 110 thereon, and a plurality of alignment marks 402 is disposed on the reverse side 40B of the each die 410 of the wafer 40 as shown in FIG. 2B. According to above described, the plurality of dies 410 is obtained by cutting the wafer 40, and the plurality of dies is transferred from a process of pick and place to another substrate 100. Due to the pitches among these dies on the new substrate 100 is wider than the each die 410. Thus, these dies 410 are transferred from pick and place to the new substrate 100 that would be introduced the mis-alignment. Due to the ball mounted process also would not be aligned in subsequently process, and the reliability of the package structure would be decreased. Therefore, in this embodiment, before sawing process is performed, the reverse side of wafer 40 is turned upward, and the plurality of alignment marks 402 is formed in the x-y direction on the reverse side of each die 410. Then, each die 410 is transferred from pick and place to the substrate 100 by pick and place apparatus (not shown in Figure). Because the alignment mark 402 is formed on the reverse side of each die 410, so that the pick and place apparatus can discriminate the position for the pads of each die 410 to place the dies on the substrate 100 directly. The die 410 did not overturn to place on the substrate 100 so that the pick and placing apparatus can determine the reference point of the substrate 100 that corresponding position of the die 410 when the die 410 is disposed on the substrate 100. Herein, the formation of alignment mark 402 is formed by photo-etching process, in which the plurality of alignment marks 402 is formed on the reverse side 40B of the wafer 40, and the shape of the alignment mark 402 can be geometric shape. In another embodiment, the geometric shape is a crisscross-type. On the other hand, the formation of the alignment mark 402 also includes laser marks process.

Figure 3:
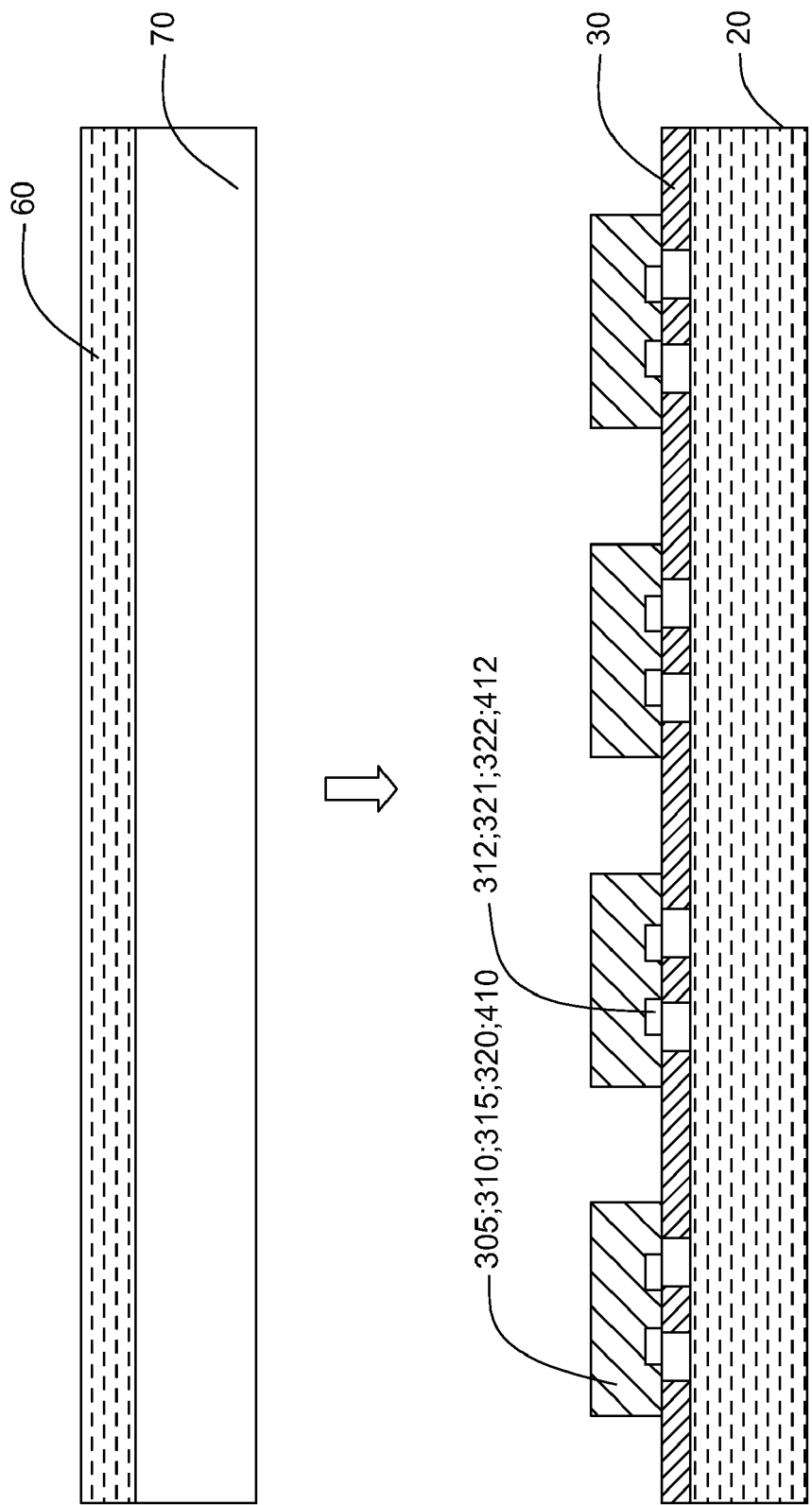

Referring to FIG. 3 shows a cross-sectional of the embodiment of this invention. As shown in FIG. 3, a polymer material 30 is disposed on the substrate 20, and the polymer material 30 having a plurality of regions with at least one slits 32. In this embodiment, the material of polymer material 30 such as silicon rubber, silicon resin, elastic PU, porous PU, acrylic rubber, or dice cutting rubber. On the other hand, the material of polymer material 30 can be a B-stage material or photo sensitive film. Especially, when the polymer material 30 is B-stage material, after the polymer material 30 is formed on the substrate 20, the pre-baking process is alternatively process to perform in this embodiment. The B-stage material 30 is baked in an environment at temperature is range of 80° C. to 100° C. and the duration is 5 to 10 minutes, so that the B-stage material 30 with liquid state is transformed into an adhesive layer with viscosity state and assembled with substrate 20.

Then, the plurality of dies 410 with a plurality of alignment marks on the reverse side 40B is pick and placed by the pick and place apparatus (not shown in Figure), and is attached to each region of the polymer material 30 which is formed on the substrate 20. The active surface (not shown) of the dies 410 is disposed on the polymer material 30, and the plurality of pads 412 is aligned the slits 32, and being exposed by the slits 32. It is noted that the arrangement of slits 32 is disposed depending on the arrangement of the pads 412 of the each die 410 which being packaged, for example, the pads 412 is disposed in a row in the middle of each die 410; in addition, the pads 412 is disposed in two rows in the middle of the each die 410, for example, the dynamic random access memory (DRAM), as shown in this embodiment of the present invention.

Next, the B-stage material 70 is formed on another substrate 60; similarly, the material of substrate 60 is selected from the group consisting of: glass, quartz, ceramic, wiring board, or metal foil, and not limitation in this embodiment. Thereafter, a pre-baking process is an alternatively process to perform in this embodiment, for example, the B-stage material 70 is baked in an environment at temperature that is range of 80° C. to 100° C. and the duration is 5 to 10 minutes, so that the B-stage material 70 is became an adhesive layer with liquid state, and is assembled with the substrate 60. It is noted that the thickness of the B-stage material 70 is larger than the thickness of each dies 410, for example, 3-20 mil. The assembled substrate 60 and the B-stage material 70 is overturned, so that the B-stage material 70 is adhered the reverse side 40B of the each dies 410 on the substrate 20, as shown in FIG. 3.

Figure 4:
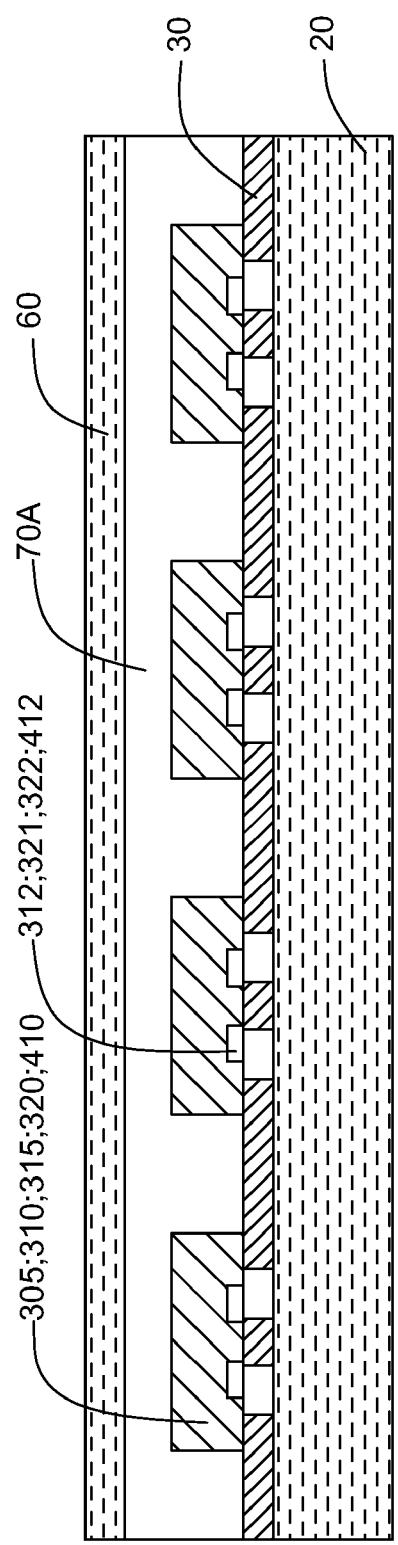
Figure 5:
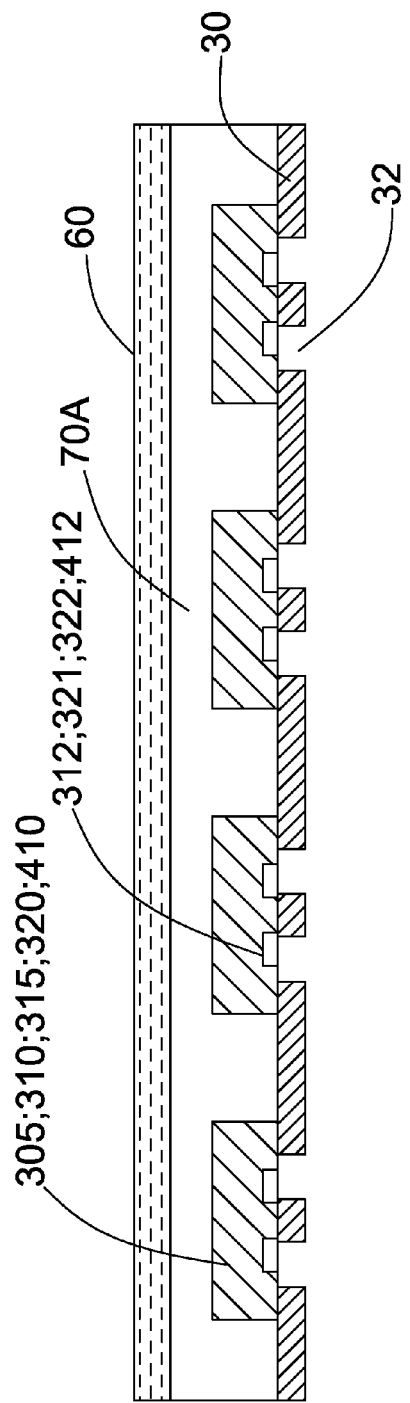

Then, the B-stage material 70 is pressed down toward the substrate 60, so that the five sides of each die 410 is covered by the B-stage material 70 as shown in FIG. 4. Next, a baking process is performed in an environment at temperature that is range 120° C. to 125° C. and the duration is 20 to 60 minutes, so that the B-stage material 70 can be solidified to be a package body 70A. Thereafter, the substrate 60 can be separated from the package body 70A to expose the surface of the package body 70A, and to expose the active surface of each die 410. Next, the surface of package body 70 is formed a plurality of sawing lines 414 by the cutting means (not shown in Figure). Herein, the depth of each sawing line 414 is 0.5 mil to 1 mil, and the width of the sawing lines 414 is 5 um to 25 um. In one preferred embodiment, the sawing lines 414 can be formed as perpendicular and crisscross and used as the reference line for cutting the dies 410. Next, the substrate 20 is separated from the polymer material 30. it is obviously, each die 410 is encapsulated by the package body 70A, and the active surface of each die 410 is covered by the polymer material 30, in which the plurality of pads 412 on the active surface of the each die 410 can be exposed from the slit 32 that is formed on the polymer material 30 as shown in FIG. 5. Due to the plurality of sawing lines 414 is provided on the surface of the package body 70A, the strain stress of the package body 70A could be reduced by the region is constructed of the sawing lines 414, when the polymer material 30 is separated from the package body 70A, thus, the curl issue of the package body can be solved.

As shown in FIG. 5, the exposed pads 412 is not contacted the polymer material 30, thus, a plurality of fan out metal traces 90 can be formed on the pads 412 by using the process of redistribution layer after the surface of the pads 412 is to be cleaned or oxide layer on the surface of the pads 412 is to be removed. The one ends of metal traces is electrically connected the pads 412 that is disposed on the active surface of die 410, and another end is extended toward the peripheral of the die 410. Then, a protective layer 80 is formed on the plurality of metal traces 90, and the plurality of openings 82 is formed on one ends of each metal trace 90 as shown in FIG. 7. Next, a plurality of connecting elements 420 is formed on each opening 82 to electrically connect another device (not shown). In this embodiment, the connecting elements 420 can be metal bump or solder bump as shown in FIG. 7. Next, the package body 70A is cut to form a plurality of packaged die individually as shown in FIG. 8. It is obviously, the five surfaces of each die 410 is encapsulated by the package body 70A which is made of B-stage material 70, and the active surface of die 410 is covered by the polymer material 30. Meanwhile, due to the alignment marks 402 is disposed on the reverse side 40B of the die 410, such that the metal traces 90 and the connecting elements 420 can be electrically connected the pads 412 accurately, thus, the reliability of the die packaged can be improved.

Figure 6:
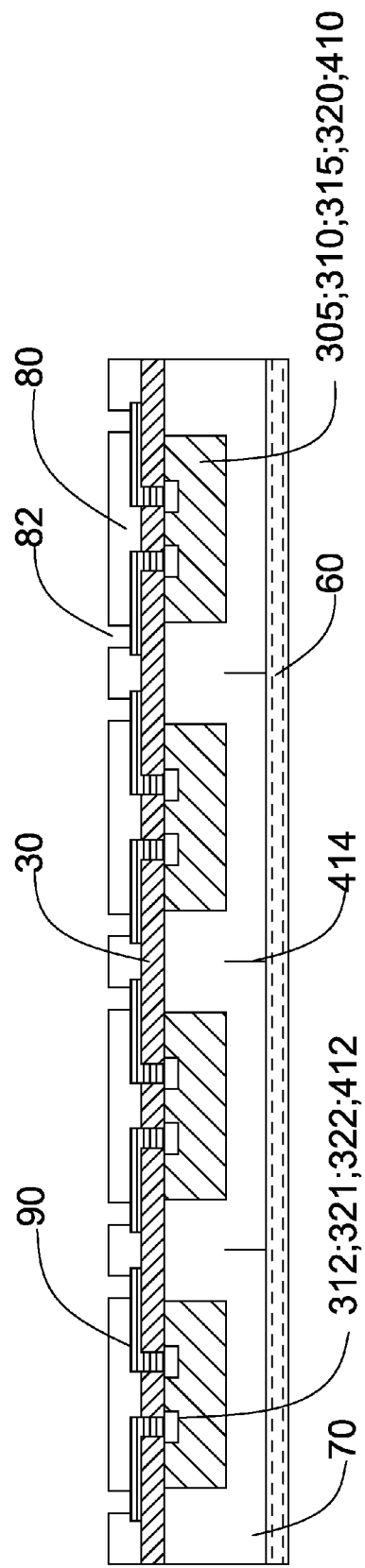

Nevertheless, in one preferred embodiment, the polymer material 30 can be replaced with the B-stage material. After the plurality of dies 410 is encapsulated by the B-stage material 70, a baking process is performed to solidify the B-stage material 70. Thus, the substrate 20 is separated from solidified B-stage material 30/70. then, after the exposed surface of pads 412 is cleaned or the oxide layer (not shown) is provided on the pads 412 that is removed, the plurality of fan-out metal traces 90 is formed on the exposed pads 412 by using the process of redistribution layer (RDL), in which one ends of metal traces 90 is electrically connected each pad 412 that is disposed on the active surface of the each die 410, and another ends of the metal trace 90 is extended toward the peripheral of each die 410. next, a protective layer 80 is formed on the metal traces 90 by using semiconductor manufacturing process, and a plurality of openings 82 is formed on another ends of each metal traces 90 as shown in FIG. 6. Finally, a plurality of connecting elements 420 is formed on each opening 82 to electrically connect another device (not shown). In this embodiment, the connecting elements 420 can be metal bump or solder bump as shown in FIG. 7. Next, the package body 70A is cut to form a plurality of die package individually.

In addition, according to above described, the reverse side of the each die package 410 having a substrate 60 that used as the heat dissipation element as shown in FIG. 8. Of course, according to packaging process, the substrate 60 can be separated to expose the reverse side of the die 410. thereafter, a plurality of sawing lines 414 is formed on the reverse side of package body 70A by the cutting means (not shown) after substrate is separated, in which the depth of each sawing lines 414 is about 0.5 mil to 1 mils, and the width of each sawing lines 414 is about 5 um to 25 um. In one preferred embodiment, the sawing lines 414 can be formed as perpendicular and crisscross and used as the reference line for cutting the dies 410. Due to the plurality of sawing lines 414 is provided on the surface of the package body 70A, the strain stress of the package body 70A could be reduced by the region is constructed of the sawing lines 414, when the polymer material 30 is separated from the package body 70A, thus, the curl issue of the package body can be solved.

Figure 9:
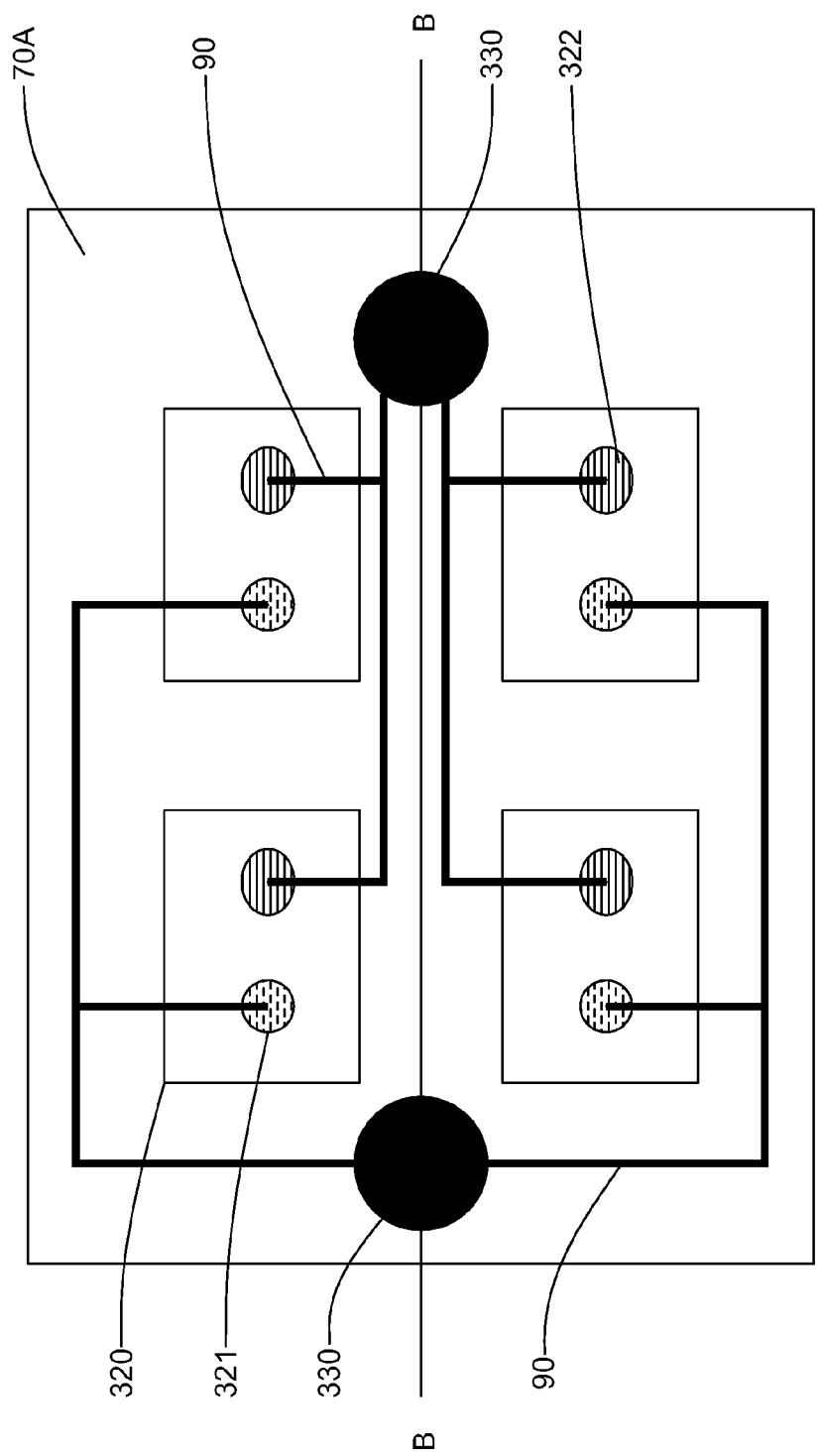

According to above described, present invention further provides a module for multiple die package structure. Referring to FIG. 9, shows the package module is constructed from the plurality of same dies. In this embodiment, the description shows the LED module is constructed from four LED dies; on the other hands, the plurality of same dies also can be DRAM.

Please refer to FIG. 9 again; the die 320 can be LED. The p electrode 322 of each LEDs 320 is electrically connected the adjacent P electrode 322 of the other LED 320, and the N electrode 321 of the LED 320 is electrically connected the adjacent N electrode 321 of the other LED 320, in which each N electrode 321 and P electrode 322 of each LED 320 is electrically connected the connecting elements 330 via the metal traces 90. Similarly, the number of the LED 320 or the connection between the LEDs is not limitation in this embodiment. For example, the plurality of LEDs is constructed in series connection to form a cylindrical light source, or in a parallel connection to form a plane light source; meanwhile, the color of the LED is not limitation in this embodiment, that is, the LED 320 can be red LED, green LED, or blue LED, or other color LED such as white LED or the combination of above LEDs. Furthermore, when the die 320 is DRAM, the number of pads (not shown) of each DRAM is the same and the patterned metal traces can be applied to electrically connect the each DRAM. For example, the four DRAMs with 256 MB is packaged in series connection or in parallel connection to construct memory module with 1 GB. The formation of the patterned metal traces is not the key feature in this embodiment, thus, the present invention did not described in detail.

Figure 10:
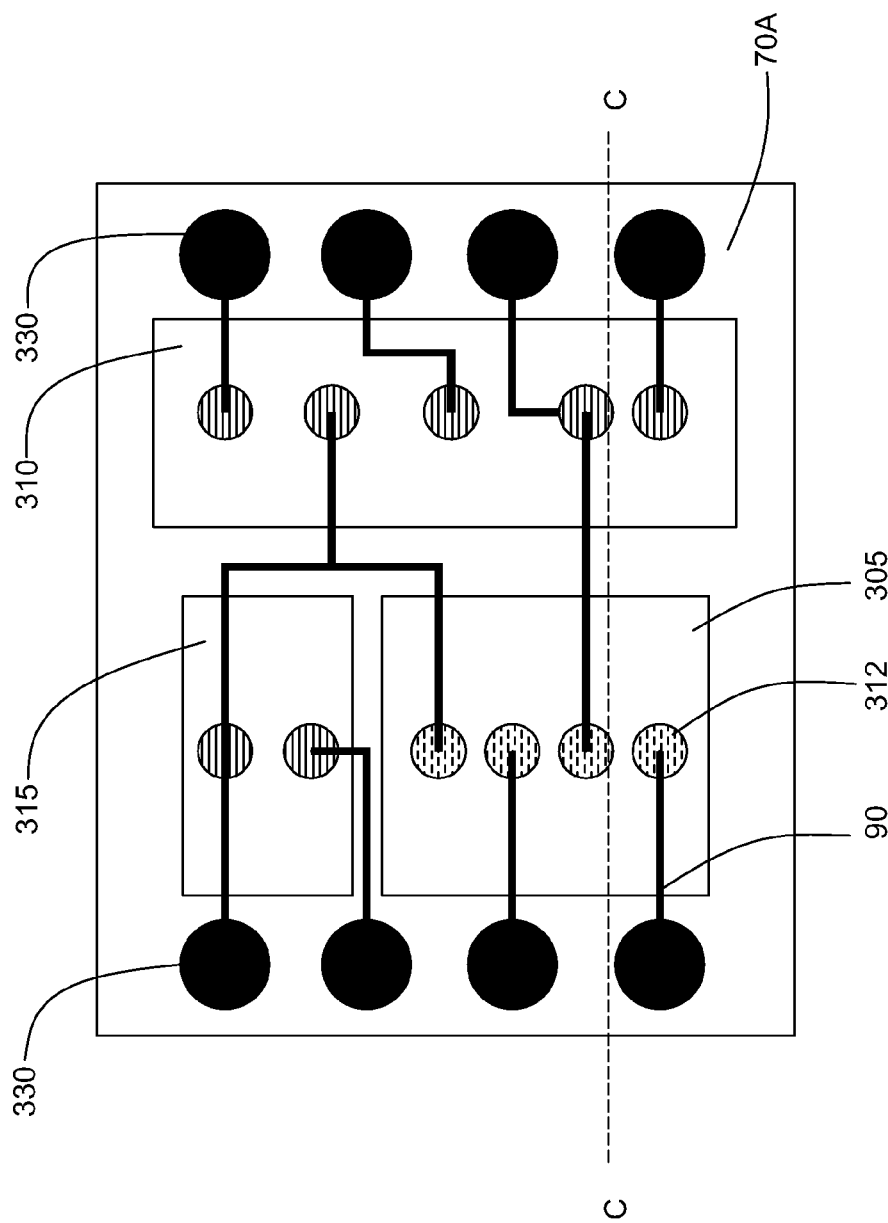

Furthermore, the present invention also provides a package module is constructed from a plurality of dies with different size or different function. As shown in FIG. 10, shows the top view of the packaged die which having different size or different function. It is obviously, the die module is a SIP (system-in-package) which is constructed from a plurality of dies with different size or function. In this embodiment, the plurality of dies includes a microprocessor means 305, memory means 310 or memory controller means 315, in which the active surface of each die having a plurality of pads thereon, and a plurality of patterned metal traces is formed on the pads of each die, and the layout for the patterned metal traces can be arranged in series connection or in parallel connection to electrically connect the connecting elements.

Herein, the formation of the package process for the module is similar to the FIG. 3 through FIG. 6.

Firstly, a polymer material 30 is disposed on the substrate 20, and the plurality of regions with at least one slits 32 is formed in the polymer material 30. The material of polymer material 30 can be a paste with elasticity, such as silicon rubber, silicon resin, elastic PU, porous PU, acrylic rubber, or dice cutting rubber. Furthermore, the material of polymer material 30 can be a B-stage material or photo sensitive film. Especially, when the polymer material 30 is B-stage material, after the polymer material 30 is formed on the substrate 20, the pre-baking process is alternatively process to perform in this embodiment. The B-stage material 30 is baked in an environment at temperature is range of 80° C. to 100° C. and the duration is 5 to 10 minutes, so that the B-stage material 30 with liquid state is transformed into an adhesive layer with viscosity state and assembled with substrate 20. Then, the plurality of dies 305, 310, 315, 320, with a plurality of alignment marks on the reverse side 40B is pick and placed by the pick and place apparatus (not shown in Figure), and is attached to the each regions of the polymer material 30 which is formed on the substrate 20. The active surface (not shown) of the dies 305, 310, 315, 320 is electrically connected the polymer material 30, and the plurality of pads 412 is aligned the slits 32, and being exposed by the slits 32 within the polymer material 30. It is noted that the arrangement of slits 32 is disposed depend on the arrangement of the pads 412 of the dies 305, 310, 315, 320 which being packaged, for example, the pads 412 is disposed in a row in the middle of each dies 305, 310, 315, 320; in addition, the pads 412 is disposed in two rows in the middle of the each dies 305, 310, 315, 320, for example, the dynamic random access memory (DRAM).

Next, the B-stage material 70 is formed on another substrate 60; similarly, the material of substrate 60 is selected from the group consisting of: glass, quartz, ceramic, wiring board, or metal foil, and not limitation in this embodiment. Thereafter, a pre-baking process is an alternatively process to perform in this embodiment, for example, the B-stage material 70 is baked in an environment at temperature that is range of 80° C. to 100° C. and the duration is 5 to 10 minutes, so that the B-stage material 70 is became an adhesive layer with liquid state, and is assembled with the substrate 60. It is noted that the thickness of the B-stage material 70 is larger than the thickness of each dies 305, 310, 315, 320, for example, 3-20 mil. The assembled substrate 60 and the B-stage material 70 is overturned, so that the B-stage material 70 is adhered the reverse side 40B of the each dies 305, 310, 315, 320 on the substrate 20, as shown in FIG. 3.

Then, the B-stage material 70 is pressed down toward the substrate 60, so that each dies 305, 310, 315, 320 is covered by the B-stage material 70 as shown in FIG. 4. Next, a baking process is performed in an environment at temperature that is range 120° C. to 125° C. and the duration is 20 to 60 minutes, so that the B-stage material 70 can be solidified to be a package body 70A. Thereafter, the substrate 60 can be separated from the package body 70A to expose the surface of the package body 70A. Next, the surface of package body 70 is formed a plurality of sawing lines 414 by the cutting means (not shown in Figure). Herein, the depth of each sawing lines 414 is 0.5 mil to 1 mil, and the width of the sawing lines 414 is 5 um to 25 um. In one preferred embodiment, the sawing lines 414 can be formed as perpendicular and crisscross and used as the reference line for cutting the dies 305, 310, 315, 320. Next, the substrate 20 is separated from the polymer material 30. It is obviously, each dies 305, 310, 315, 320 is encapsulated by the package body 70A, and the active surface of each dies 305, 310, 315, 320 is covered by the polymer material 30, in which the plurality of pads 412 on the active surface of the each dies 305, 310, 315, 320 can be exposed from the slit 32 that is formed on the polymer material 30 as shown in FIG. 5. Due to the plurality of sawing lines 414 is provided on the surface of the package body 70A, the strain stress of the package body 70A could be reduced by the region is constructed of the sawing lines 414, when the polymer material 30 is separated from the package body 70A, thus, the curl issue of the package body can be solved.

As shown in FIG. 5, the exposed pads 412 is not contacted the polymer material 30, thus, a plurality of fan out metal traces 90 can be formed on the pads 412 by using the process of redistribution layer (RDL) after the surface of the pads 412 is to be cleaned or oxide layer on the surface of the pads 412 is to be removed. The one ends of metal traces 90 is electrically connected the pads 412 that is disposed on the active surface of dies 305, 310, 315, 320, and another end is extended toward the peripheral of the die 412. Then, a protective layer 80 is formed on the plurality of metal traces 90, and the plurality of openings 82 is formed on one ends of each metal traces 90 as shown in FIG. 11. Next, a plurality of connecting elements 420 is formed on each openings 410 to electrically connect another device (not shown). In this embodiment, the connecting elements 420 can be metal bump or solder bump as shown in FIG. 12. Next, the package body 70A is cut to form a plurality of packaged dies 1000 individually as shown in FIG. 13. The package body can be a single die package body, or a plurality of dies with package body. When the package body is a module package body, the dimension of plurality of dies can be in the same, for example, LED or DRAM. Of course, the module package body can be constructed from the plurality of dies with different dimensions, for example, microprocessor means, memory means, or memory controller means, or LEDs with different color. It is obviously, the five sides of each dies 305, 310, 315, 320 is encapsulated by the package body 70A which is made of B-stage material 70, and the active surface of each dies 305, 310, 315, 320 is covered by the polymer material 30. Meanwhile, due to the alignment marks 402 is disposed on the reverse side 40B of each dies 305, 310, 315, 320, such that the metal traces 90 and the connecting elements 420 can be electrically connected the pads 412 accurately, thus, the reliability of the module with packaged 10000 can be improved.

In addition, according to above described, the reverse side of the each packaged dies 410 having a dissipation element 60 as shown in FIG. 13A. The formation is that the substrate 60 is not separated from the package body, thus, the substrate 60 can use as the dissipation element, especially for the substrate 60 is made of metal. In addition, the reverse side 40 of the die with packaged body is to be exposed by thinning process, and a dissipation element is attached to the exposed reverse side of the die as shown in FIG. 13B.

Then, FIG. 14 shows a cross-sectional view of another embodiment of this present invention. As shown in FIG. 14, after the active surface of the plurality of dies 410 is assembled with the polymer material 30 such as photo-sensitive material, the plurality of pads 412 is exposed from the silts within the polymer material 30; then, a polymer material 700 is coated over the substrate 20 and the portion of the plurality of dies 410, and the polymer material 700 is pressed by a molding apparatus 500 to form a flat surface on the polymer material 700, and the polymer material 700 is filled between each dies 410 and each dies 410 is encapsulated by the polymer material 700 as shown in FIG. 14. The material of polymer material 700 can be silicon rubber, epoxy, acrylic, or BCB. Next, the flat polymer material 700 is performed a baking process to solidified the polymer material 700. Thereafter, the molding apparatus 500 is separated from the solidified polymer material 700 to expose the surface of the polymer material 700 as shown in FIG. 15. Next, the substrate 20 is separated from the photo-sensitive material 30 so as to the polymer material 700 is remained on the active surface of each dies 410. It is obviously, the five sides of each dies 410 is covered by the polymer material 700, and the pads 412 on the active surface of each dies 410 is exposed from the slits 32 within the polymer material 30. next, after the exposed pads 412 is to be cleaned or the oxide layer on the surface of the pads 412 is to be removed, the plurality of fan-out metal traces 90 is formed on the exposed pads 412 of each dies 410 by using the process of redistribution layer (RDL). Thereafter, a protective layer 80 is formed on the plurality of metal traces 90 via semiconductor manufacturing process, and a plurality of openings 82 is formed on another ends of each metal traces 90. Finally, a plurality of connecting elements 420 is formed on each openings 82, such that the connecting elements 420 can use as the connecting point to electrically connect exterior device, in which the connecting elements 420 can be a metal bump or solder ball.

Then, the polymer material 700 is cut to obtain a plurality of package bodies individually. The package body can be a single die package body or a module package body with a plurality of dies. The dimension of the plurality of dies of the module package body can be identical, such as LED or DRAM. Alternatively, the dimension of the plurality of dies of the module package body can be different, such as microprocessor means, memory means, memory controller means, or LEDs with different colors. It is obviously, the five sides of each dies 410 is covered by the polymer material 700, and the active surface of each dies 410 is covered by the polymer material 30. Meanwhile, the plurality of metal traces and the connecting elements 420 can electrically connect the each pads 412 accurately according to the alignment marks 402 is provided on the reverse side 40B of the each dies 410, thus, the reliability of the die package can be improved.

Figure 16:
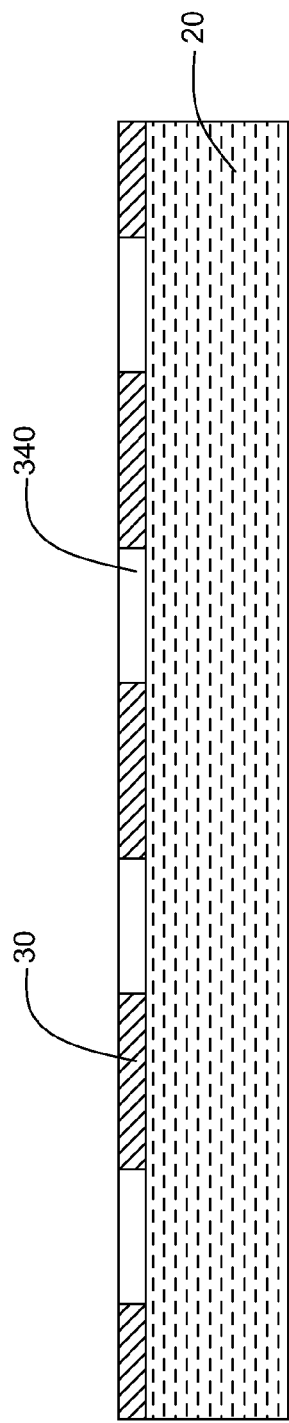
Figure 17:
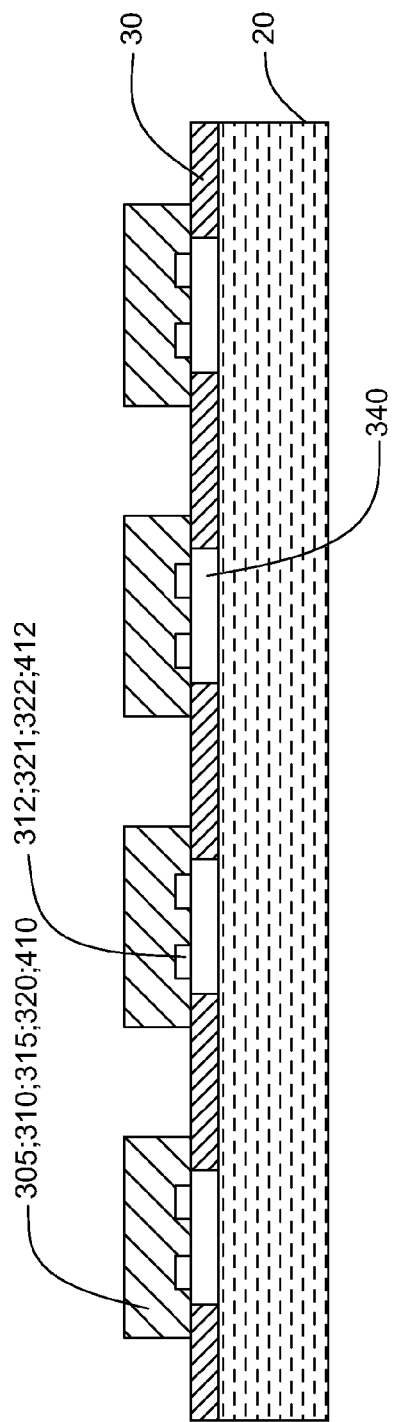

As shown in FIG. 16 and FIG. 17, show the cross-sectional views of yet embodiment of the present invention. As shown in FIG. 16, the polymer material 30 is disposed on the substrate 20, and the polymer material 30 having a plurality of regions with at least one slits 32. In this embodiment, the material of polymer material 30 such as silicon rubber, silicon resin, elastic PU, porous PU, acrylic rubber, or dice cutting rubber. On the other hand, the material of polymer material 30 can be a B-stage material or photo sensitive film. Especially, when the polymer material 30 is B-stage material, after the polymer material 30 is formed on the substrate 20, the pre-baking process is alternatively process to perform in this embodiment. The B-stage material 30 is baked in an environment at temperature is range of 80° C. to 100° C. and the duration is 5 to 10 minutes, so that the B-stage material 30 with liquid state is transformed into an adhesive layer with viscosity state and assembled with substrate 20.

Then, the plurality of dies 410 with a plurality of alignment marks on the reverse side 40B is pick and placed by the pick and place apparatus (not shown in Figure), and is attached to the each regions of the polymer material 30 which is formed on the substrate 20. The active surface (not shown) of the dies 410 is electrically connected the polymer material 30, and the plurality of pads 412 is aligned the slits 32, and being exposed by the slits 32 within the polymer material 30. It is noted that the arrangement of slits 32 is disposed depend on the arrangement of the pads 412 of the dice 410 which being packaged, for example, the pads 412 is disposed in a row in the middle of each dies 410; in addition, the pads 412 is disposed in two rows in the middle of the each dies 410, for example, the dynamic random access memory (DRAM), as shown in this embodiment of the present invention.

Next, the B-stage material 70 is formed on another substrate 60; similarly, the material of substrate 60 is selected from the group consisting of: glass, quartz, ceramic, wiring board, or metal foil, and not limitation in this embodiment. Thereafter, a pre-baking process is an alternatively process to perform in this embodiment, for example, the B-stage material 70 is baked in an environment at temperature that is range of 80° C. to 100° C. and the duration is 5 to 10 minutes, so that the B-stage material 70 is became an adhesive layer with liquid state, and is assembled with the substrate 60. It is noted that the thickness of the B-stage material 70 is larger than the thickness of each dies 410, for example, 3-20 mil. The assembled substrate 60 and the B-stage material 70 is overturned, so that the B-stage material 70 is adhered the reverse side 40B of the each dies 410 on the substrate 20.

Figure 18:
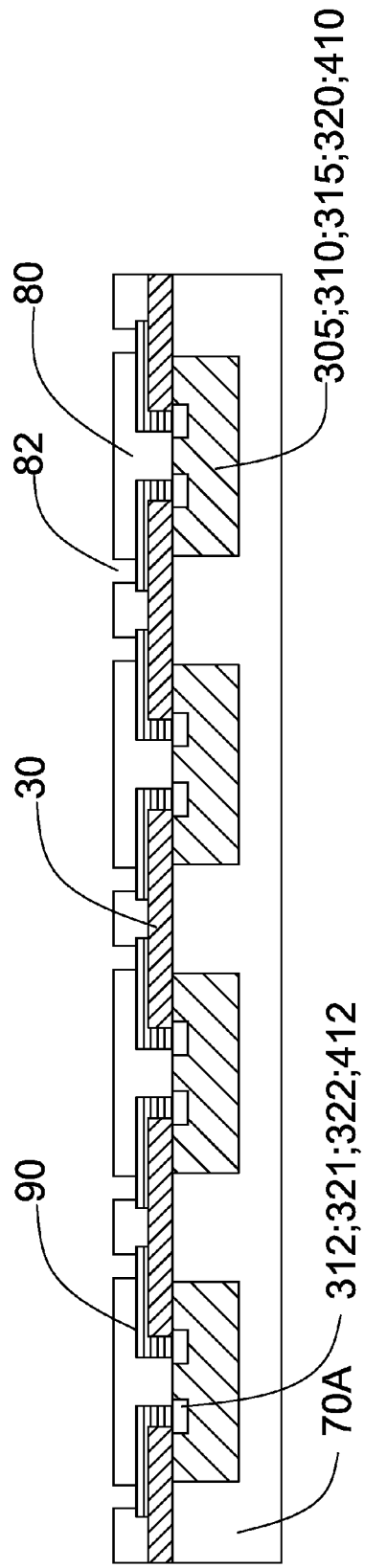
Figure 19:
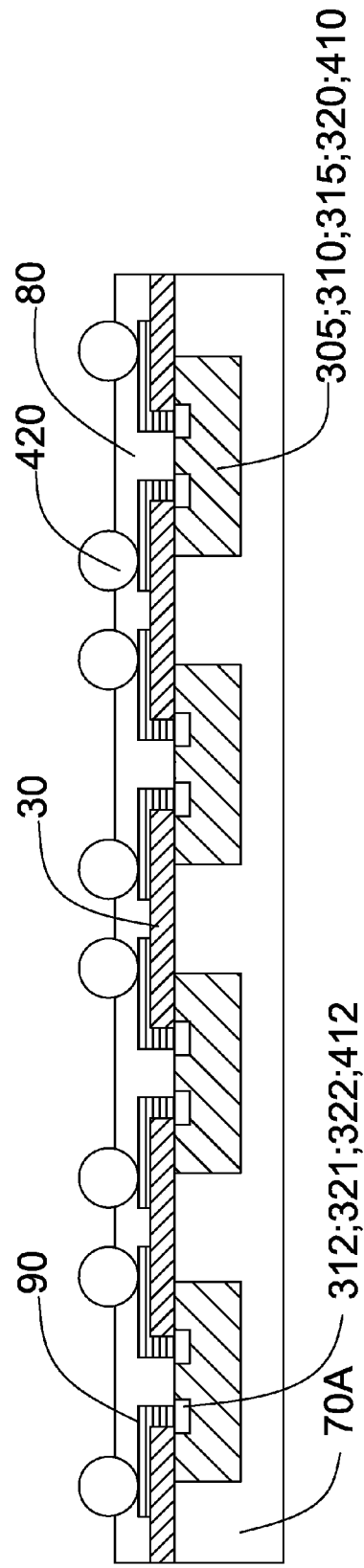

Then, the B-stage material 70 is pressed down toward the substrate 60, so that each dies 410 is covered by the B-stage material 70. Next, a baking process is performed in an environment at temperature that is range 120° C. to 125° C. and the duration is 20 to 60 minutes, so that the B-stage material 70 can be solidified to be a package body 70A. Thereafter, the substrate 60 is separated from the package body 70A. It is obviously, each dies 410 is covered by the package body 70A, and the active surface of each dies 410 is covered by the polymer material 30, in which the plurality of pads 412 on the active surface of each dies 410 can be exposed from the slits which is formed within the polymer material 30. Due to the exposed pads 412 is not contact the polymer material 30, a suitable cleaning process is applied to clean the surface of pads 412 or remove the oxide layer on the surface of pads 412. Then, a protective layer (not shown) with a plurality of openings 340 is formed on the polymer material 30 and the pads 412 of each die 410 being exposed from openings 340. Next, a plurality of fan-out metal traces 90 is formed on the plurality of pads 412 by using the process of redistribution layer (RDL), and another protective layer 80 is formed on the plurality of metal traces 90, and a plurality of openings 82 is formed on each metal traces 90 as shown in FIG. 18. Then, a plurality of connecting elements 420 is formed on each openings 82 which is used as the connecting point for connecting exterior elements (not shown), in which the connecting elements 420 can be metal bump or the solder ball as shown in FIG. 19. Finally, the package body 70A is cut to obtain a plurality of packaged dies. It is obviously, the five sides of each die 410 is covered by the package body 70A which is made of B-stage material 70, and the active surface of each die 410 is covered by the polymer material 30 with an opening 340. Meanwhile, due to the alignment marks 402 is disposed on the reverse side 40B of each die 410 so as to the plurality of metal traces 90 and the connecting elements 420 can be electrically connected the each pad 412 accurately, and the reliability of die packaged 410 can be improved.

Furthermore, the material of polymer material 70A can be silicon rubber, epoxy resin, acrylic, or BCB, the package process is similar to above description, which is not described in detail.

The above embodiments are also applied to package the plurality of dies to form a module package structure as shown in FIG. 9 and FIG. 10. Due to the package process is all the same as above descriptions, this it would not describe in detail herein, and the module package structure as shown in FIG. 21.

Although specific embodiments have been illustrated and described, it will be appreciated by those skilled in the art that various modifications may be made without departing from the scope of the present invention, which is intended to be limited solely by the appended claims.

What is claimed is:

1. A die rearrangement package structure, comprising:
a substrate;
a die having an active surface and a bottom surface, and a plurality of pads is disposed on said active surface;
a B-stage material is disposed on said substrate for covering the five sides of said die and exposing said active surface of said die;
a polymer material for covering said active surface of said die and said polymer material having at least one slit to expose said plurality of pads on said active surface of said die;
one ends of a plurality of metal traces is electrically connected said plurality of pads;
a protective layer for covering a portion of said polymer material and said plurality of metal traces, and exposing another ends of said plurality of metal traces; and
a plurality of connecting elements for electrically connecting another ends of said plurality of metal traces.

2. A die rearrangement package structure, comprising:
a substrate;
a die having an active surface and a reverse side, and a plurality of pads is disposed on said active surface;
a B-stage material is disposed on said substrate for covering the five sides of said die and exposing said active surface;
a polymer material for covering said active surface of said die and said polymer material having an opening to expose said plurality of pads on said active surface of said die;
one ends of a plurality of metal traces for electrically connecting with said plurality of pads;
a protective layer for covering a portion of said polymer material and said plurality of metal traces, and exposing another ends of said plurality of metal traces; and
a plurality of connecting elements for electrically connecting with another ends of said plurality of metal traces.

3. A die rearrangement package structure, comprising:
a substrate;
a plurality of dies, each said plurality of dies having an active surface and a reverse side, and a plurality of pads is disposed on said active surface;
a B-stage material is disposed on said substrate for covering the five sides of each said plurality of dies and exposing said active surface of said plurality of dies;
a polymer material for covering said active surface of said plurality of dies and said polymer material having slits to expose said plurality of pads on said active surface of said plurality of dies;
one ends of a plurality of metal traces for electrically connecting said plurality of pads;
a protecting layer for covering a portion of said polymer material and said plurality of metal traces and another ends of said metal traces being exposed; and
a plurality of connecting element for electrically connecting with another ends of said metal traces.

4. A die rearrangement package structure, comprising:
a substrate;
a plurality of dies having an active surface and a bottom surface, and a plurality of pads is disposed on said active surface;
a B-stage material is disposed on said substrate for covering the five sides of each said plurality of dies and exposing said active surface of said plurality of dies;
a polymer material for covering said active surface and said polymer material having an opening to expose said plurality of pads;
one ends of a plurality of metal traces for electrically connecting said plurality of pads;
a protective layer for covering a portion of said polymer material and said plurality of metal traces, and another ends of said plurality of metal traces being exposed; and
a plurality of connecting elements for electrically connecting with another ends of said plurality of metal traces.

* * * * *